(12) United States Patent
Shen

(10) Patent No.: US 7,235,770 B2
(45) Date of Patent: Jun. 26, 2007

(54) METHOD FOR CALIBRATING DEVIATION OF OECFS AND APPARATUS THEREOF

(75) Inventor: Yu-Chuan Shen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 70 days.

(21) Appl. No.: 11/161,305

(22) Filed: Jul. 29, 2005

(65) Prior Publication Data

US 2006/0231735 A1 Oct. 19, 2006

(30) Foreign Application Priority Data

Apr. 15, 2005 (TW) .............................. 94111960 A

(51) Int. Cl.
*H01L 27/00* (2006.01)
(52) U.S. Cl. .............................. 250/208.1; 250/252.1; 382/254
(58) Field of Classification Search ........ 348/187–189, 348/207.99, 335, 360, 362, 370, 371; 250/208.1, 250/252.1, 372; 382/254, 162, 167, 312
See application file for complete search history.

(56) References Cited

U.S. PATENT DOCUMENTS

| | | | |
|---|---|---|---|
| 6,768,509 B1* | 7/2004 | Bradski et al. | 348/207.99 |
| 2003/0044144 A1* | 3/2003 | Nelson et al. | 385/123 |
| 2003/0142374 A1* | 7/2003 | Silverstein | 358/504 |
| 2004/0108448 A1* | 6/2004 | Bosser | 250/252.1 |

* cited by examiner

*Primary Examiner*—Georgia Epps
*Assistant Examiner*—Francis M. LeGasse, Jr.
(74) *Attorney, Agent, or Firm*—Jianq Chyun IP Office

(57) ABSTRACT

A method suitable for calibrating the deviation of opto-electronic conversion functions (OECFs) in an imaging apparatus is provided. The method of calibrating the deviation of OECFs comprises the following steps. First, the imaging apparatus captures a first image. Next, the imaging apparatus performs an image calibration process with respect to the first image to capture a second image and simultaneously obtain an OECF set. The OECF set includes at least an optical characteristic value of the second image and at least an electrical characteristic value of the imaging apparatus. Finally, the aforementioned steps are repeated to obtain a number of images and their corresponding OECF sets.

19 Claims, 6 Drawing Sheets

METHOD FOR CALIBRATING DEVIATION OF OECFS AND APPARATUS THEREOF

CROSS-REFERENCE TO RELATED APPLICATION

This application claims the priority benefit of Taiwan application serial no. 94111960, filed on Apr. 15, 2005. All disclosure of the Taiwan application is incorporated herein by reference.

BACKGROUND OF THE INVENTION

1. Field of the Invention

The present invention relates to a method for calibrating the deviation of opto-electronic property and apparatus thereof. More particularly, the present invention relates to a method for calibrating deviation in the opto-electronic property of an imaging device and apparatus thereof.

2. Description of the Related Art

In recent years, the computation power of computers increases at a rapid pace and digital media has become one of the major instruments for expressing creativity and imagination. With the development of imaging products based on opto-electronic sensing and related principles, images of various types can be recorded and stored in digital format. There are a number of different digital imaging products including thin film transistor liquid crystal displays (TFT-LCD), digital still cameras, digital video camcorders, scanners and printers, to name a few. In general, the ultimate quality of the output images depends on the front-end image-capturing devices, the digital image processor and the back-end digital image output devices.

After a digital image has been digitally processed, the image is output from the back-end equipment of the digital imaging apparatus as an image display or a document output. Digital image processing (DIP) is a process of using a computer to process two or three-dimensional images. First, an analogue image is 'digitized' (that is, converting analogue data into digital '0' and '1' data). The method includes 'sampling' the image on all locations and then analyzing and recording the brightness, color and location of each point. Each sampling point of the image is called a pixel and the image is constructed from a set of pixels. Furthermore, the image data related to each pixel including its location, color and brightness are stored as data arrays inside the computer ready for processing.

The aforementioned digital data will pass through the front-end image data input device, the digital image process (DIP) and the back-end image data output device. The DIP uses, for example, various types of image-processing software to perform all kinds of local or whole image processing tasks such as color addition/subtraction, brightness or chromatic adjustment, or deformation or image enlargement/reduction. After the computer has performed arithmetic or logic computations on each element in the data array, the results are displayed on a color display screen. That is, the conventional method uses a software-based (S/W-based) approach for controlling the quality of image, with the image data undergoing sophisticated color reproduction computations using color property files (the files containing the color data standard set by the International Color Consortium (ICC)). In other words, the conventional method provides very little consideration regarding the properties of apparatus or the hardware (H/W-based).

In addition, the front-end image data input device will perform an image-capturing process to obtain the required image data. Similarly, the back-end image data output device will display an image according to the digital data. However, the input and the output of the image data are closely related to the response characteristic of the apparatus or hardware. In other words, both the original image data obtained from the front-end image data input device and the back-end image output device for outputting image are equally critical to the image quality. Therefore, the front-end image data input device and the back-end image output device may affect the image through their intrinsic hardware properties. One major factor affecting the image is the so-called opto-electronic conversion functions (OECFs) or opto-electronic properties for short. Conventionally, for imaging apparatus such as liquid crystal displays, digital cameras or scanners, image properties are adjusted by software registered values after the ultimate output is obtained from the chip or liquid crystal. For example, the image properties are adjusted according to a look-up table (LUT) represented by a matrix.

In the following, an actual example of a common opto-electronic conversion is illustrated. FIG. 1 is a perspective view showing the panel structure of a thin film transistor liquid crystal display (TFT-LCD). As shown in FIG. 1, the thin film transistor (TFT) serves as an electronic switch for controlling video signals and the liquid crystal plays the role of optical switches for the transmission of light from the back-light module to the eyes of a human. In the path of propagation of light, the opto-electronic conversion is based on the opto-electronic properties of the liquid crystal. For example, the liquid crystal molecules will rotate according to a specified voltage and hence has a particular light transmittance. FIG. 2 is a graph showing the opto-electronic curves of liquid crystal molecules under fringe field switching (FFS) mode, in-plane switching (IPS) mode and twisted nematic (TN) mode (the opto-electronic curves of transmittance versus voltage).

Similarly, each image-capturing device such as the digital still camera and the digital video camcorders has a complementary metal oxide silicon (CMOS) image-sensing module. FIG. 3 is a schematic diagram of a pixel array of CMOS image sensors (only a single CMOS image sensor is shown). As shown in FIG. 3, the operating principle of each CMOS image sensor includes absorbing the light from an incident light beam through a photodiode and converting the light energy into an electronic signal to obtain an image data. FIG. 4 is a graph showing the brightness versus voltage opto-electronic characteristic curves of a CMOS image-sensing pixel array corresponding to the three primary colors (red, green and blue).

However, for the image display device or the image capturing device inside an imaging apparatus such as the display panel (for example, a liquid crystal display) or the sensor module (for example, a charge-coupled device image sensor or a complementary metal oxide semiconductor image sensor), any deviation in opto-electronic characteristic of the hardware is not rectified. In a word, the effect of the opto-electronic characteristic of the hardware on the output image is often neglected. Therefore, the original raw opto-electronic conversion factors (OECFs) in the apparatus will lead to a distortion of the original image and result in image quality problems including chromatic aberration, color temperature error, low contrast, shift in the gray scale or unstable skin tone color.

In brief, because the conventional imaging apparatus often disregards the opto-electronic characteristics of the apparatus itself, the output image is often distorted and has a poor display quality. Furthermore, the conventional method merely uses software and complicated color reproduction techniques to adjust the quality of images. Thus, the present invention proposes a method for calibrating the deviation of opto-electronic characteristics and apparatus thereof so that the opto-electronic characteristics of the imaging apparatus are suitably considered. Ultimately, image distortion is minimized and a better control of the image quality is obtained.

SUMMARY OF THE INVENTION

Accordingly, at least one objective of the present invention is to provide a method for calibrating the deviation of opto-electronic conversion functions (OECFs). The method is suitable for correcting the deviation of opto-electronic characteristics in an imaging apparatus and resolving the problems of not considering the effect of opto-electronic deviation of the imaging device on the quality of the image in a conventional method.

At least a second objective of the present invention is to provide an apparatus for calibrating the deviation of opto-electronic conversion functions (OECFs).

To achieve these and other advantages and in accordance with the purpose of the invention, as embodied and broadly described herein, the invention provides a method for calibrating the deviation of OECFs. The method of calibrating the deviation of OECFs comprises the following steps. First, the imaging apparatus captures a first image. Next, the imaging apparatus performs an image calibration process with respect to the first image to capture a second image and simultaneously obtain an OECF set. The OECF set includes at least an optical characteristic value of the second image and at least an electrical characteristic value of the imaging apparatus. Finally, the aforementioned steps are repeated to obtain a number of images and their corresponding OECF sets.

The present invention also provides an apparatus for calibrating the deviation of opto-electronic conversion functions (OECFs). The apparatus for calibrating the deviation in OECFs includes a light source, a physical reference object, an imaging apparatus and an image calibration unit. The physical reference object is disposed within the illuminating area of the light source. The imaging apparatus is also disposed within the light source illuminating area for capturing a plurality of images of the physical reference object. The image calibration unit is connected to the imaging apparatus for performing an image calibration of a first image.

As described, the imaging apparatus first captures a first image of the physical reference object. Then, the image calibration unit performs an image calibration process with respect to the first image to capture a second image and simultaneously obtain an OECF set. The OECF set includes at least an optical characteristic value of the second image and at least an electrical characteristic value of the imaging apparatus. Finally, the aforementioned steps are repeated to obtain a number of OECF sets.

According to one embodiment of the present invention, the image calibration process includes adjusting the color deviation, the color temperature error, the image contrast, the image gray scale or the skin color stability.

According to one embodiment of the present invention, the imaging apparatus is an image sensor for sensing an image and capturing the image data. The image sensor can be a charged-couple device (CCD) sensor or a complementary metal oxide semiconductor (CMOS) sensor.

According to one embodiment of the present invention, the imaging apparatus is an image display device. The image display device can be a liquid crystal display or a light-emitting diode display.

According to one embodiment of the present invention, the imaging apparatus is an optical measuring instrument.

According to one embodiment of the present invention, the imaging apparatus is a data output device. The data output device can be a printer or a scanner.

According to one embodiment of the present invention, the optical characteristic values can be the brightness level, the illumination level, the transmittance, the reflectance, the refractive index and the optical frequency spectrum.

According to one embodiment of the present invention, the electrical characteristic values can be a voltage, a current, a resistance and a power rating.

According to one embodiment of the present invention, the physical reference object is a reflecting body.

According to one embodiment of the present invention, the physical reference object is a transparent body disposed between the light source and the imaging apparatus.

According to one embodiment of the present invention, the apparatus for calibrating the deviation of OECFs includes an optical board for providing a relative position in space or in plane between the physical reference object and the imaging apparatus.

According to one embodiment of the present invention, the apparatus for calibrating the deviation of OECFs further includes a calibration base for adjusting the imaging apparatus so that the image of the physical reference object is within the reception range of the imaging apparatus.

According to one embodiment of the present invention, the apparatus for calibrating the deviation of OECFs further includes an optical fiber for transmitting images.

Therefore, the present invention provide a method for calibrating the deviation of opto-electronic conversion functions (OECFs) and an apparatus thereof with due consideration regarding the opto-electronic characteristics of the imaging apparatus. As a result, image distortion is minimized and a better control of the image quality is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
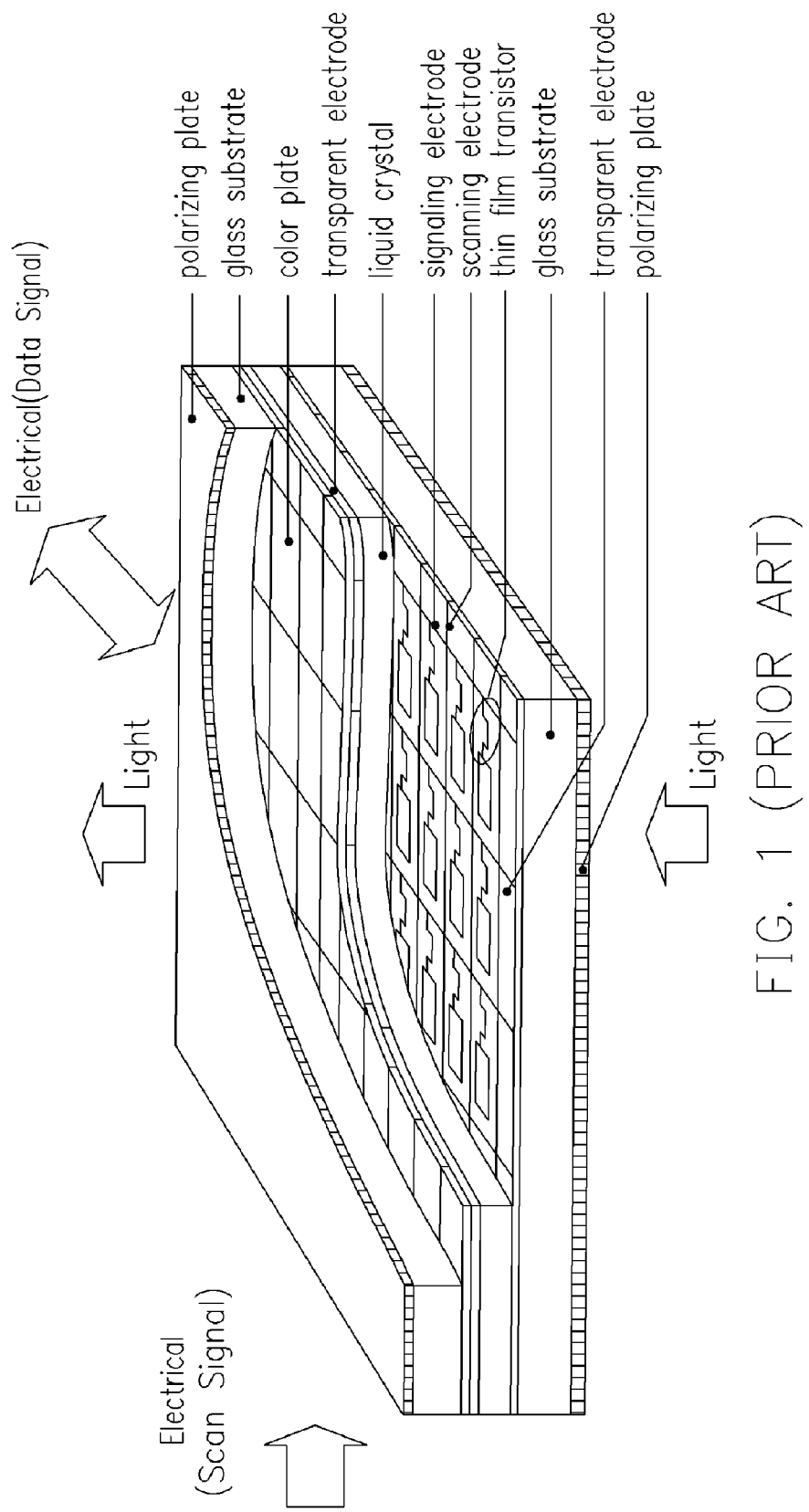
FIG. 1 is a perspective view showing the basic elements of a conventional thin film transistor liquid crystal display (TFT-LCD).
Figure 2:
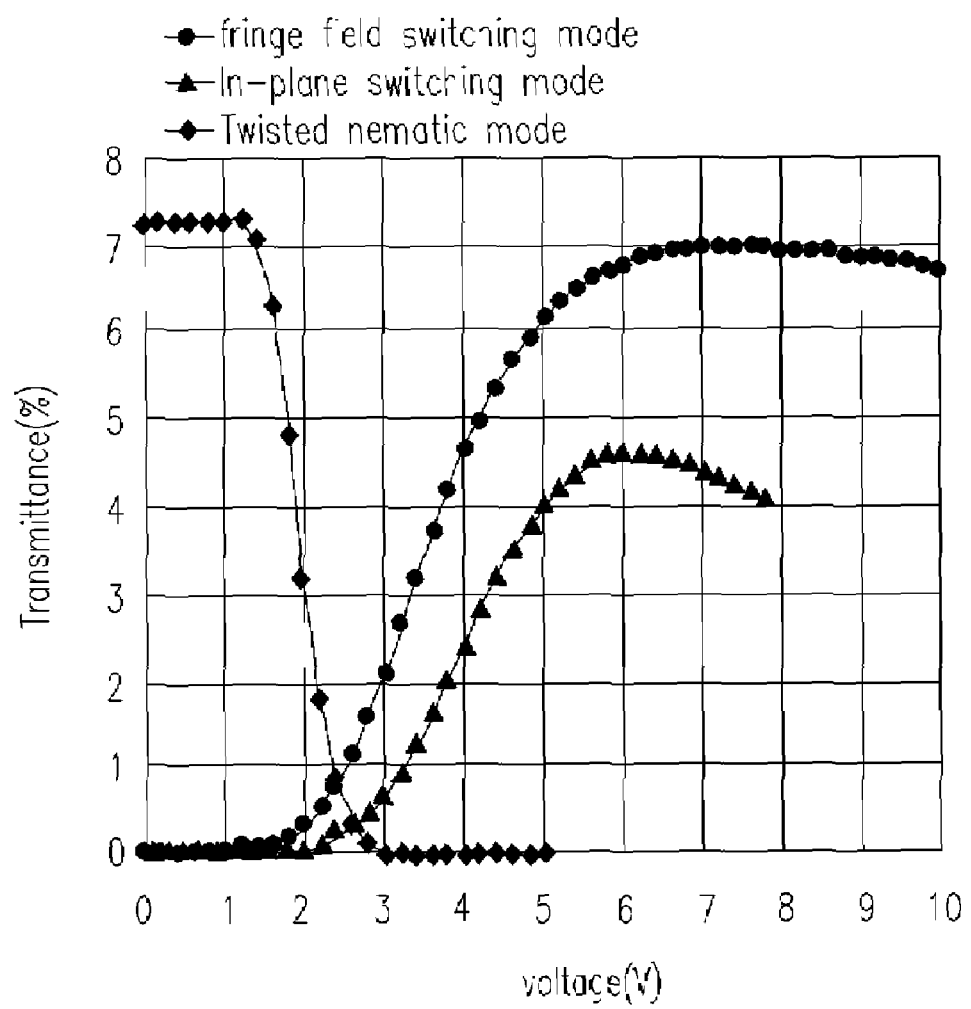
FIG. 2 is a graph showing the opto-electronic curves of liquid crystal molecules, the opto-electronic curves relating transmittance to voltage.
Figure 3:
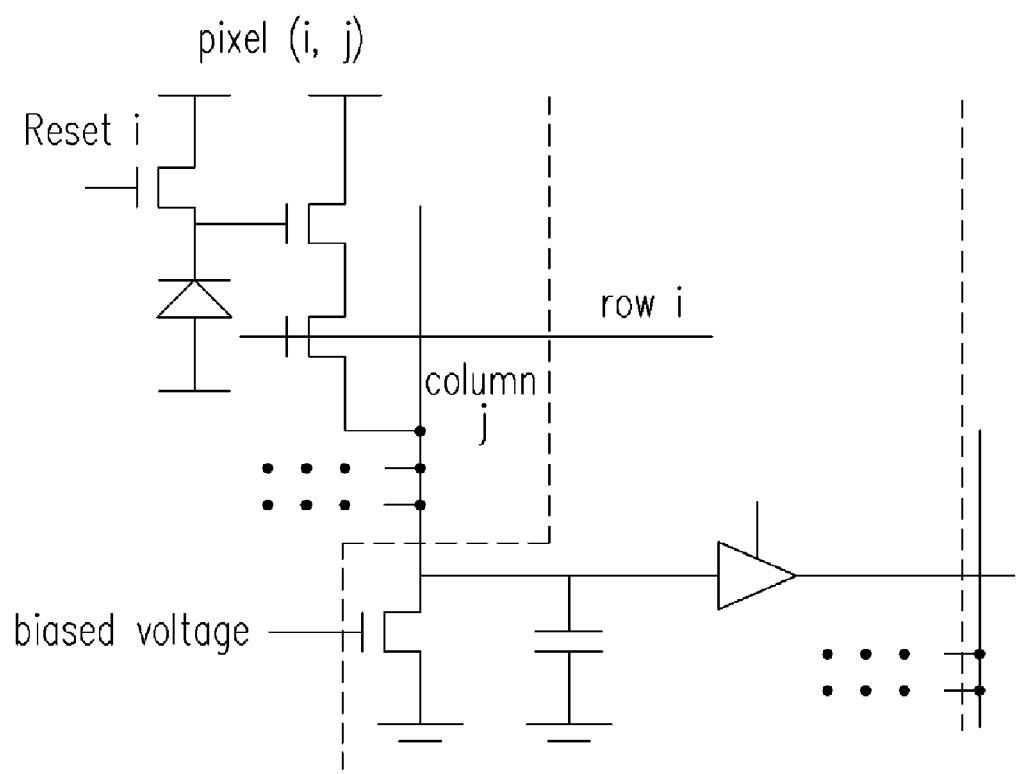
FIG. 3 is a schematic diagram of conventional CMOS image sensor.
Figure 4:
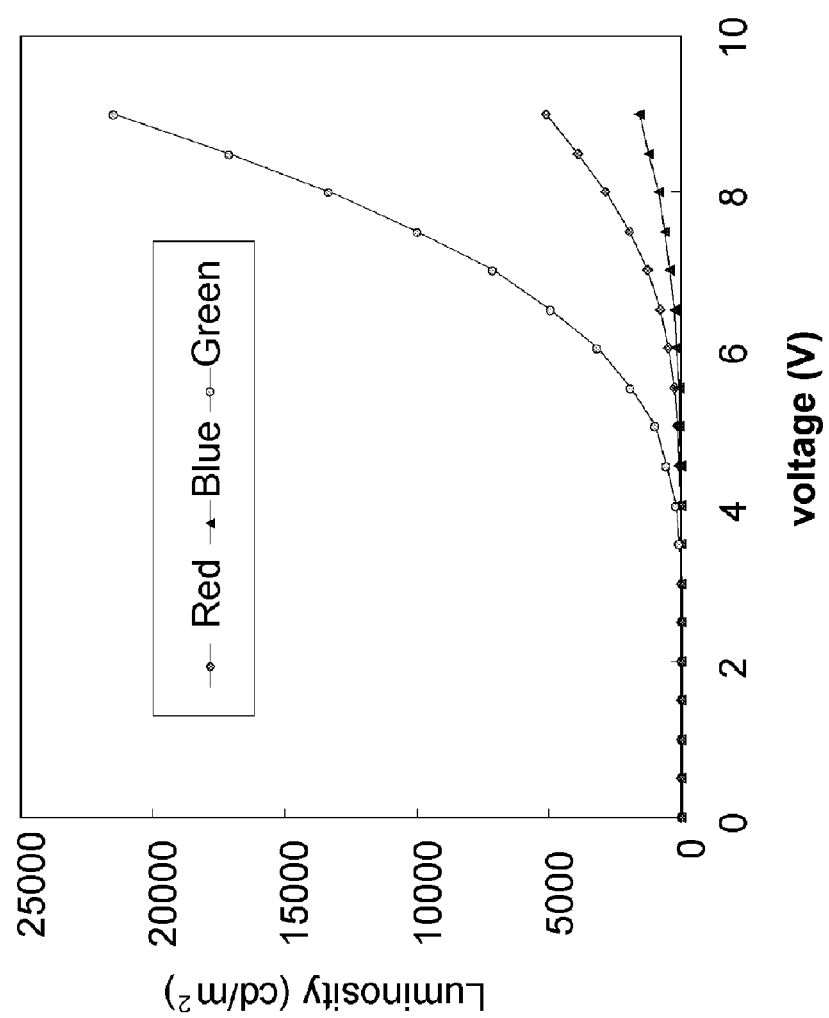
FIG. 4 is a graph showing the opto-electronic characteristic curves of a conventional CMOS image-sensing pixel array for the three primary colors (red, green and blue).

Reference will now be made in detail to the present preferred embodiments of the invention, examples of which are illustrated in the accompanying drawings. Wherever possible, the same reference numbers are used in the drawings and the description to refer to the same or like parts.

Figure 5:
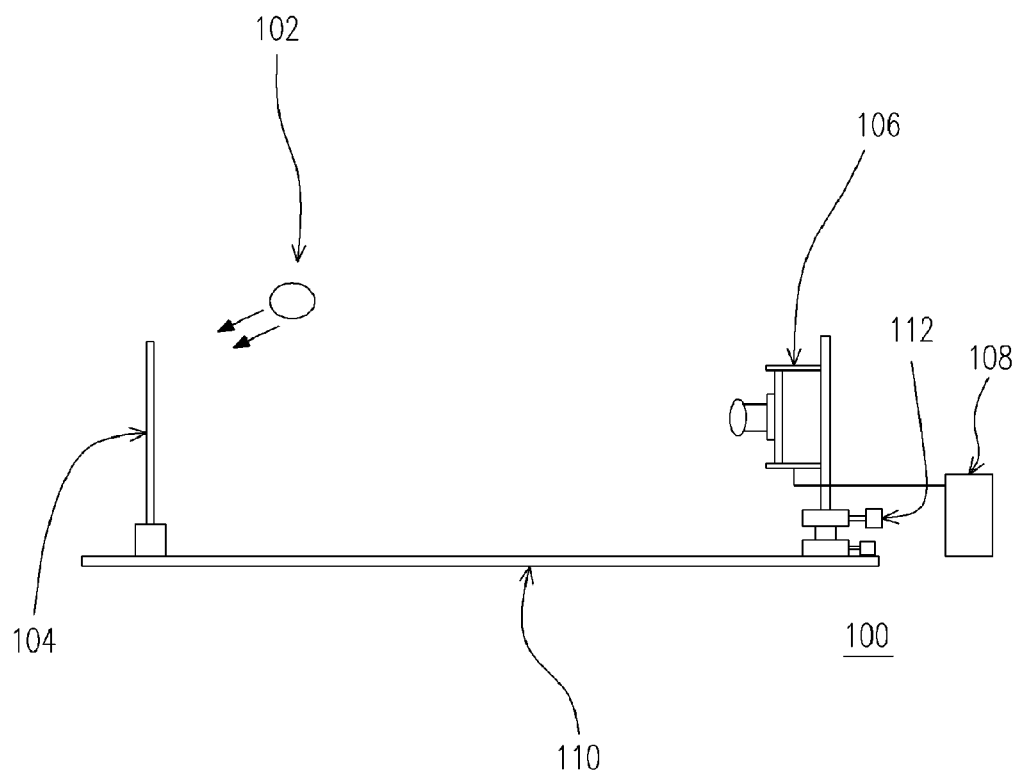
FIG. 5 shows an apparatus for calibrating the deviation in the OECFs according to one embodiment of the present invention.

FIG. 5 shows an apparatus for calibrating the deviation in the OECFs according to one embodiment of the present invention. As shown in FIG. 5, the apparatus for calibrating the deviation of opto-electronic characteristics includes a light source 102, a physical reference object 104, an imaging apparatus 106 and an image calibration unit 108. The physical reference object 104 is disposed within the illuminating range of the light source 102. The imaging apparatus 106 is also disposed within the illuminating range of the light source 102 for capturing a plurality of images of the physical reference object 104. The image calibration unit 108 is connected to the imaging apparatus 106 for calibrating the captured images.

In the present embodiment, the physical reference object 104 is a reflective body, for example. The apparatus 100 may further include an optical board 110 and a calibration base 112. The optical board 110 is disposed between the physical reference object 104 and the imaging apparatus 106 for defining the space or plane for separating the physical reference object 104 and the imaging apparatus 106 without interfering with the optical phenomena of absorption or reflection of light during the calibration process. The calibration base 112 is used for setting the location, the viewing angle and the physical angle of the imaging apparatus 106 so that the image of the physical reference object 104 can fall within the image reception range of the imaging apparatus 106.

As shown in FIG. 5, the light source 102 shines on the physical reference object 104. The imaging apparatus 106 in the present embodiment is an image-sensing device, for example. The imaging apparatus 106 receives the reflected light from the physical reference object 104 that originated from the light source 102 to sense a first image and capture the first image data. The first image is an initial raw image, that is, an image of the physical reference object 104. Next, the image calibration unit 108 performs an image calibration process with respect to the first image and then the imaging apparatus 106 captures a second image. It should be noted that the image calibration could include color deviation, color temperature error, image contrast, image gray scale or skin tone stability. After the image calibration process, other image processes including focusing and exposure may be carried out to produce a calibrated good raw second image.

In the meantime, the image calibration unit 108 obtains an opto-electronic conversion function (OECF) set. The OECF set includes at least an optical characteristic value of the second image and at least an electrical characteristic value of the imaging apparatus 106. The optical characteristic values may include the brightness level, the illumination level, the transmittance, the reflectivity, the refractive index and the visible light spectrum. The electrical characteristic values may include the voltage, the current, the resistance and the power rating.

Finally, the aforementioned steps are repeated to obtain a plurality of OECF sets. Therefore, the opto-electronic characteristics of the imaging apparatus 106 are calibrated.

In the embodiment of the present invention, the image sensing device in the imaging apparatus for sensing an image and capturing the image data can be a charge-coupled device (CCD) or a complementary metal oxide semiconductor (CMOS) image sensor.

In addition, in one embodiment of the present invention, the imaging apparatus is an image display device. The image display device can be a liquid crystal display or a light-emitting diode display.

In one embodiment of the present invention, the imaging apparatus can be an optical measuring instrument.

In one embodiment of the present invention, the imaging apparatus can be a data output device. The data output device includes a printer or a scanner.

Figure 6:
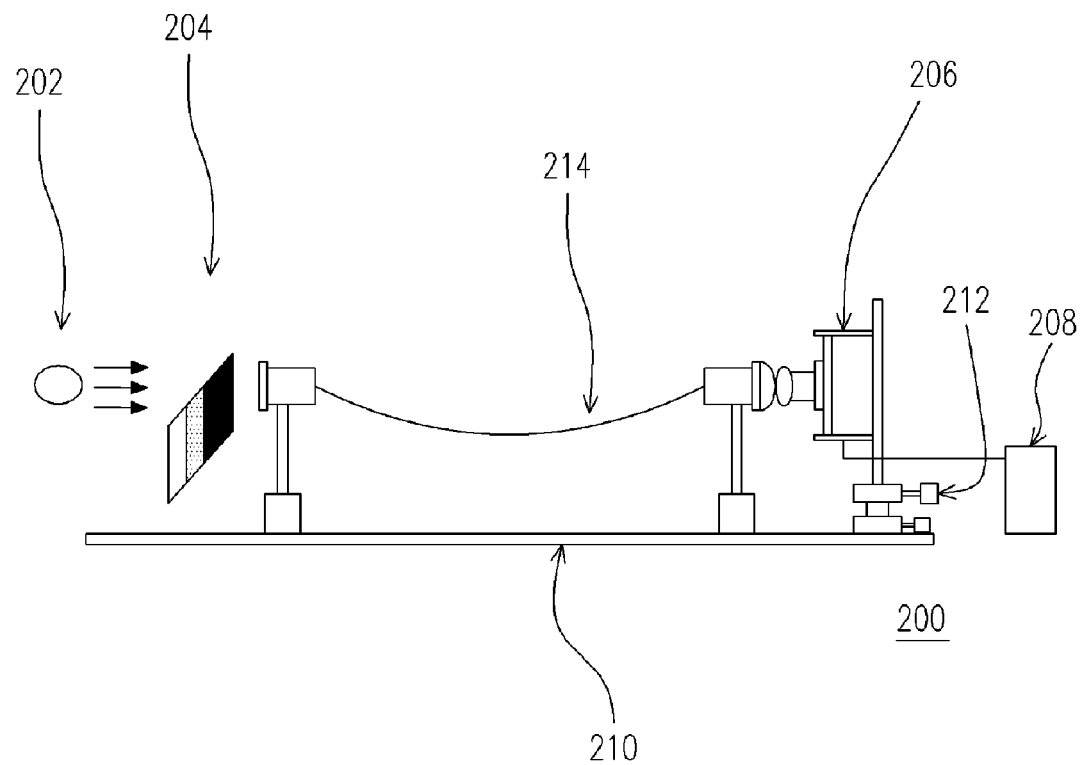
FIG. 6 shows an apparatus for calibrating the deviation in the OECFs according to another embodiment of the present invention.

FIG. 6 shows an apparatus for calibrating the deviation in the OECFs according to another embodiment of the present invention. As shown in FIG. 6, the apparatus 200 for calibrating the deviation of OECFs includes a light source 202, a physical reference object 204, an imaging apparatus 206 and an image calibration unit 208. The physical reference object 204 is disposed within the illuminating range of the light source 202. The imaging apparatus 206 is also disposed within the illuminating range of the light source 202 for capturing a plurality of images of the physical reference object 204. The image calibration unit 208 is connected to the imaging apparatus 206 for calibrating the captured images.

In the present embodiment, the physical reference object 204 is a transparent body, for example. The apparatus 200 may further include an optical board 210, a calibration base 212 and an optical fiber 214. The optical board 210 is disposed between the physical reference object 204 and the imaging apparatus 206 for defining a relative position in space or in a relative plane, separating the physical reference object 204 and the imaging apparatus 206 without interfering with the absorption or reflection of light, as an optical behavior during the calibration process. The calibration base 212 is used for setting the location, the viewing angle and the physical angle of the imaging apparatus 206 so that the image of the physical reference object 204 can fall within the image reception range of the imaging apparatus 206.

As shown in FIG. 6, the light source 202 shines on the physical reference object 204. The imaging apparatus 206 in the present embodiment is an image-sensing device, for example. The imaging apparatus 206 receives the light transmitted through the physical reference object 204 that originated from the light source 202 to sense a first image and capture the first image data. The first image is an initial raw image, that is, an image of the physical reference object 204. Then, the image calibration unit 208 performs an image calibration process with respect to the first image and then the imaging apparatus 206 captures a second image. It should be noted that the image calibration could include color deviation, color temperature error, image contrast, image gray scale or skin tone stability. After the image calibration process, other image processes including focusing and exposure may be carried out to produce a calibrated good raw second image.

In the meantime, the image calibration unit 208 obtains an opto-electronic conversion function (OECF) set. The OECF set includes at least an optical characteristic value of the second image and at least an electrical characteristic value of the imaging apparatus 206. The optical characteristic values may include the brightness level, the illumination level, the transmittance, the reflectivity, the refractive index and the visible light spectrum. The electrical characteristic values may include the voltage, the current, the resistance and the power rating.

Finally, the aforementioned steps are repeated to obtain a plurality of OECF sets. Therefore, the opto-electronic characteristics of the imaging apparatus 206 are calibrated.

In the embodiment of the present invention, the image sensing device in the imaging apparatus for sensing an image and capturing the image data can be a charge-coupled device (CCD) or a complementary metal oxide semiconductor (CMOS) image sensor.

In addition, in one embodiment of the present invention, the imaging apparatus is an image display device. The image display device can be a liquid crystal display or a light-emitting diode display.

In one embodiment of the present invention, the imaging apparatus can be an optical measuring instrument.

In one embodiment of the present invention, the imaging apparatus can be a data output device. The data output device includes a printer or a scanner.

The present invention provides a method for calibrating the deviation of opto-electronic conversion functions (OECFs) and an apparatus thereof with better consideration regarding the opto-electronic characteristics of the imaging apparatus so that image distortion is minimized and a better control of the image quality is obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for calibrating the deviation of opto-electronic conversion functions (OECFs), suitable for calibrating the deviation of OECFs in an imaging apparatus, comprising:

capturing a first image through the imaging apparatus;

performing an image calibration with respect to the first image using the imaging apparatus to capture a second image and simultaneously obtain an opto-electronic conversion factor (OECF) set, wherein the OECF set includes at least an optical characteristic value of the second image and at least an electrical characteristic value of the imaging apparatus; and repeating the aforementioned steps to obtain a plurality of images and corresponding OECF sets.

2. An apparatus for calibrating the deviation of opto-electronic conversion functions, comprising:

a light source;

a physical reference object disposed within the illuminating range of the light source;

an imaging device disposed within the illuminating range of the light source for capturing a plurality of images of the physical reference object; and an image calibration unit connected to the imaging device for calibrating the images, wherein a first image of the physical reference object is captured through the imaging device, and after calibrating the first image through the image calibration unit, a second image is also captured and simultaneously an opto-electronic conversion factor (OECF) set comprising at least an optical characteristic value of the second image and at least an electrical characteristic value of the imaging device is obtained; thereafter, the step is repeated to obtain a plurality of OECF sets.

3. The apparatus of claim 2, wherein the image calibration includes color deviation, color temperature error, image contrast, image gray scale and skin tone stability.

4. The apparatus of claim 2, wherein the imaging device comprises an image sensor for sensing an image and obtaining data of the image.

5. The apparatus of claim 4, wherein the image sensor comprises a complementary metal oxide semiconductor (CMOS) sensor.

6. The apparatus of claim 4, wherein the image sensor comprises a charge-coupled device (CCD) sensor.

7. The apparatus of claim 2, wherein the imaging device comprises an image display device.

8. The apparatus of claim 7, wherein the image display device comprises a liquid crystal display or a light-emitting diode display.

9. The apparatus of claim 2, wherein the imaging device comprises an optical measuring instrument.

10. The apparatus of claim 2, wherein the imaging device comprises a data output device.

11. The apparatus of claim 10, wherein the data output device comprises a printer or a scanner.

12. The apparatus of claim 2, wherein the optical characteristic values include the brightness level, the illumination, the transmittance, the reflectivity, the refractive index and the optical frequency spectrum.

13. The apparatus of claim 2, wherein the electrical characteristic values include voltage, current, resistance and power rating.

14. The apparatus of claim 2, wherein the physical reference object includes a reflective body.

15. The apparatus of claim 2, wherein the physical reference object includes a transparent body.

16. The apparatus of claim 14, wherein the transparent body is disposed between the light source and the physical reference object.

17. The apparatus of claim 2, wherein the apparatus further comprises an optical board for providing a relative position in space or in plane, for separating the physical reference object from the imaging device.

18. The apparatus of claim 2, wherein the apparatus further comprises a calibration base for adjusting the imaging device so that the physical reference object falls within the image reception range of the imaging device.

19. The apparatus of claim 2, wherein the apparatus further comprises an optical fiber for transmitting the image.

* * * * *